(12) United States Patent
Chuang et al.

(10) Patent No.: US 8,421,311 B2
(45) Date of Patent: Apr. 16, 2013

(54) FLEXIBLE PIEZOELECTRIC TACTILE SENSOR

(75) Inventors: Cheng-Hsin Chuang, Tainan County (TW); Yi-Rong Liou, Tainan County (TW)

(73) Assignee: Southern Taiwan University of Technology, Tainan County (TW)

( * ) Notice: Subject to any disclaimer, the term of this patent is extended or adjusted under 35 U.S.C. 154(b) by 448 days.

(21) Appl. No.: 12/771,132

(22) Filed: Apr. 30, 2010

(65) Prior Publication Data
US 2011/0266923 A1 Nov. 3, 2011

(51) Int. Cl.
*H01L 41/08* (2006.01)
(52) U.S. Cl.
USPC .............................. 310/338; 310/328; 310/800
(58) Field of Classification Search .................. 310/338, 310/328, 800
See application file for complete search history.

(56) References Cited

U.S. PATENT DOCUMENTS

| | | | | |
|---|---|---|---|---|
| 4,555,953 A * | 12/1985 | Dario et al. | ............... | 73/862.046 |
| 4,634,917 A * | 1/1987 | Dvorsky et al. | ............... | 310/328 |
| 5,209,126 A * | 5/1993 | Grahn | ..................... | 73/862.046 |
| 5,856,644 A * | 1/1999 | Burgess | ..................... | 200/61.43 |
| 5,962,118 A * | 10/1999 | Burgess | ..................... | 428/308.4 |
| 7,512,294 B2 * | 3/2009 | Wang et al. | ..................... | 385/13 |
| 8,069,735 B1 * | 12/2011 | Egorov et al. | ............ | 73/862.046 |
| 2012/0127136 A1 * | 5/2012 | Schneider et al. | ............ | 345/204 |
| 2012/0154299 A1 * | 6/2012 | Hsu et al. | ..................... | 345/173 |

\* cited by examiner

*Primary Examiner* — Jaydi San Martin
(74) *Attorney, Agent, or Firm* — Rosenberg, Klein & Lee

(57) ABSTRACT

A flexible piezoelectric tactile sensor having a piezoelectric thin film, a first flexible substrate, a second flexible substrate, and at least one elastic body is revealed. The piezoelectric thin film includes an upper surface and a lower surface while the first flexible substrate is disposed on the upper surface of the piezoelectric thin film. The first flexible substrate consists of a first surface facing the upper surface, a second surface opposite to the first surface and a plurality of first electrodes formed on the first surface. The second flexible substrate, including a third surface facing the lower surface and a plurality of second electrodes formed on the third surface, is arranged on the lower surface of the piezoelectric thin film. Both the first electrodes and the second electrode are electrically connected with the piezoelectric thin film. The elastic body is set on the second surface, corresponding to the first electrodes.

8 Claims, 7 Drawing Sheets

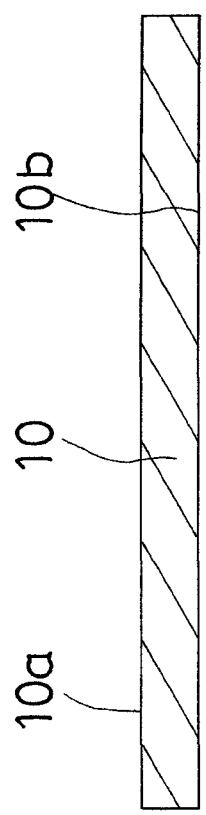

FLEXIBLE PIEZOELECTRIC TACTILE SENSOR

BACKGROUND OF THE INVENTION

1. Fields of the invention

The present invention relates to a tactile sensor, especially to a flexible piezoelectric tactile sensor that is applied to robots for control of actions such as grasping objects and motions. The tactile sensor can also be used in entertainment robots such as AIBO™ robotic pets designed and manufactured by SONY, as a communication interface between people and robotic pets.

1. In the information technology and computer field, the tactile sensors combined with monitors, used as touch input devices, have been broadly used in touch panels of Tablet personal computers (PC) and personal digital assistant (PDA), fingerprint recognition systems and virtual reality devices.

2. In the manufacturing automation, the tactile sensor is used for equipment calibration and inspection/detection device of product design. For example, the force distribution of the contact between tread patterns and the ground is obtained by the tactile sensor. Thus a tire providing better traction is designed and produced.

3. In the biomedical field, a hot device-smart skin is a typical application of the tactile sensor. As to a remote palpation system with tactile sensors developed by the research team of Professor R. Howe (Harvard Univ.), the device increases safety and reliability in detection of breast and prostate tumors.

4. In the wireless physiological monitoring, the flexible tactile sensor has a great potential in development and production of wrist mounted or patch/disposable physiological monitors for monitoring respiration, heartbeat and pulse. Thus it is worth to invest such technology.

2. Descriptions of Related Art

Most of conventional piezoelectric tactile sensors are PVDF piezoelectric films with a silver electrode layer on both sides thereof. The silver electrode layer is patterned to form structural electrodes. However, the cost of the PVDF piezoelectric film with a silver electrode layer on both sides thereof is quite high and this dramatically increases the manufacturing cost of the sensor. Moreover, the patterning of the silver electrode layer is unable to be processed by conventional printed circuit board (PCB) manufacturing processes and the related manufacturing equipments are also quite expensive. Furthermore, traditional tactile sensors are used for normal force measurement while research of tactile sensors related to lateral force or multi-axis force measurement is rare. The followings are prior arts of tactile sensors regarding multi-axis force, lateral force slippage measurement etc. Refer to Taiwanese Pat. No. 1283295, a tactile sensor is revealed. In order to detect a remote stress, the sensitivity of the stress measurement still needs to be improved. Thus at least one lower substrate, a piezoelectric layer or an upper substrate is used as a pressure boost layer. At least one protuberant part is arranged between the pressure boost layer and a lower electrode layer/or an upper electrode layer so as to reduce the surface area. Accordingly, a mechanical stress applied to the piezoelectric layer is increased. Therefore, a sensing signal is generated by the piezoelectric layer when the mechanical stress is applied to the upper electrode layer. Refer to U.S. Pat. No. 5,871,248, a robot gripper is revealed. Without prior knowledge of the object's weight, size, or dimensions, the robot gripper has the capacity to handle various objects, used to apply enough gripping force to lift the object without slippage. The robot gripper includes flexible membranes that are filled with compressible fluid therein. When the gripper surfaces simultaneously apply compression and lifting forces to the object, a shear force will be generated which will distort the material. When the distortion begins to decrease, it will be safe to lift the object. The distortion is monitored by capacitance shear force sensors. Refer to U.S. Pat. RE37065, a triaxial force sensor is disclosed. The sensor includes a hemispherical target supported by a compliant element and ultrasonic transducers. The target is displaced by sufficient force applied to elastically deform the compliant element, which displacement alters the transit times of ultrasonic signals from the transducers which are reflected from the hemispherical target. The force is determined from the transit times, the deformation response of the compliant element etc. Refer to U.S. Pat. No. 4,745,812, a sensitive high resolution microminiature tactile sensor comprises an array of micromachined bossed silicon transducer cells and a thin polymer layer protectively covering the transducer cell array. The piezoresistive resistors are provided for measurement of transducer sensor strain resulting from loading applied to the tactile sensor so as to learn load magnitude and direction of the force. Thus it is an important issue to develop a piezoelectric tactile sensor that detects both multi-axis force and material force with reduced manufacturing cost from the view of structure, material and manufacturing processes.

SUMMARY OF THE INVENTION

Therefore it is a primary object of the present invention to provide a flexible piezoelectric tactile sensor that is not produced by a PVDF piezoelectric thin film with a silver electrode layer on both sides so as to reduce material cost significantly.

In order to achieve above object, a flexible piezoelectric tactile sensor of the present invention includes a piezoelectric thin film, a first flexible substrate, a second flexible substrate, and at least one elastic body. The piezoelectric thin film includes an upper surface and a lower surface while the first flexible substrate is disposed on the upper surface of the piezoelectric thin film. The first flexible substrate consists of a first surface facing the upper surface, a second surface opposite to the first surface and a plurality of first electrodes formed on the first surface. These first electrodes are electrically connected with the piezoelectric thin film. The second flexible substrate is arranged on the lower surface of the piezoelectric thin film. The second flexible substrate is composed of a third surface facing the lower surface and a plurality of second electrodes formed on the third surface. These second electrodes are electrically connected with the piezoelectric thin film. The elastic body is set on the second surface of the first flexible substrate, corresponding to those first electrodes of the first flexible substrate. Moreover, the first flexible substrate and the second flexible substrate of the present invention are processed by conventional PCB (printed circuit board) manufacturing processes respectively so as to produce those first electrodes and second electrodes. This also results in dramatically decreasing of the manufacturing cost of the sensor.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 3A to FIG. 3E are schematic drawings showing a manufacturing flow of the flexible piezoelectric tactile sensor.

DETAILED DESCRIPTION OF THE PREFERRED EMBODIMENT

Figure 1:
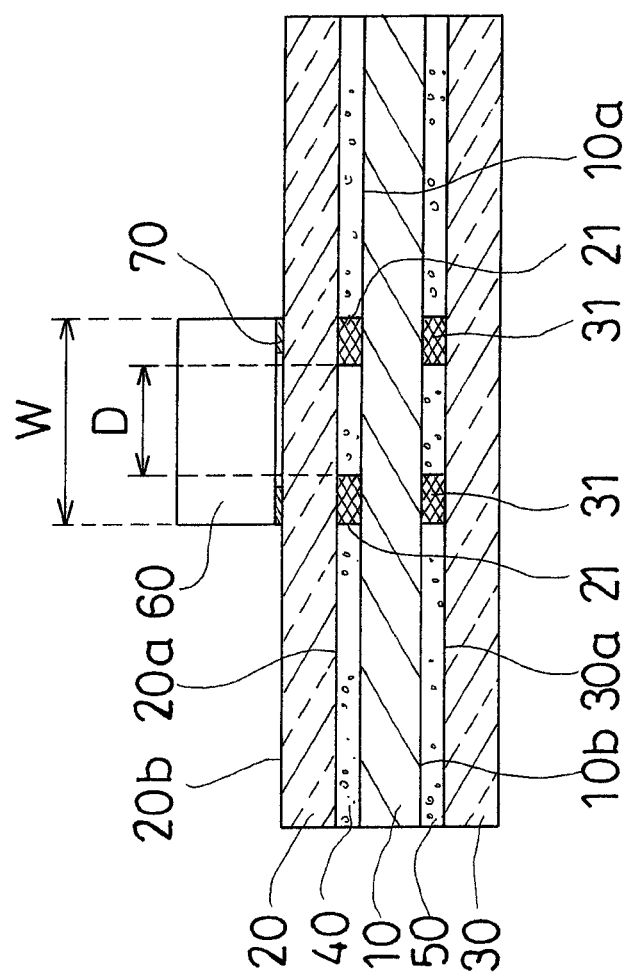
FIG. 1 is a schematic drawing showing an embodiment of a flexible piezoelectric tactile sensor according to the present invention.

Refer to FIG. 1, an embodiment of a flexible piezoelectric tactile sensor according to the present invention includes a piezoelectric thin film 10, a first flexible substrate 20, a second flexible substrate 30, a first connection layer 40, a second connection layer 50 and at least one elastic body 60. In this embodiment, the piezoelectric thin film 10 is a thin film made from polyvinylidene fluoride (PVDF) and having an upper surface 10a and a lower surface 10b. The first flexible substrate 20 is disposed on the upper surface 10a of the piezoelectric thin film 10. The first flexible substrate 20 is a Cu/Polyimide substrate and having a first surface 20a facing the upper surface 10a, a second surface 20b opposite to the first surface 20a and a plurality of first electrodes 21 formed on the first surface 20a. These first electrodes 21 are electrically connected with the piezoelectric thin film 10. In this embodiment, the first electrodes 21 are formed by patterned copper foil on a surface of the substrate and there is a certain distance D between the two adjacent first electrodes 21. Also refer to FIG. 1, the second flexible substrate 30 is arranged at the lower surface 10b of the piezoelectric thin film 10. The second flexible substrate 30 is also a Cu/Polyimide substrate and having a third surface 30a facing the lower surface 10b, and a plurality of second electrodes 31 formed on the third surface 30a. These second electrodes 31 are electrically connected with the piezoelectric thin film 10. In this embodiment, the second electrodes 31 are also formed by patterned copper foil on a surface of the substrate.

Also refer to FIG. 1, the first connection layer 40 is disposed between the first flexible substrate 20 and the piezoelectric thin film 10 for joining the first flexible substrate 20 with the piezoelectric thin film 10. As to the second connection layer 50, it is arranged between the second flexible substrate 30 and the piezoelectric thin film 10 for bonding the second flexible substrate 30 with the piezoelectric thin film 10. In this embodiment, both the first connection layer 40 and the second connection layer 50 are anisotropic conductive films (ACF). Thus the first connection layer 40 electrically connects those first electrodes 21 with the piezoelectric thin film 10 and the second connection layer 50 electrically connects those second electrodes 31 with the piezoelectric thin film 10.

Still refer to FIG. 1, the elastic body 60 is disposed on the second surface 20b of the first flexible substrate 20 and is corresponding to the first electrodes 21 of the first flexible substrate 20. In this embodiment, the elastic body 60 is a force transmission part in a columnar shape. The preferred material for the elastic body 60 is silicone rubber. Moreover, the elastic body 60 has a width of W. In this embodiment, the width W of the elastic body 60 is longer than the certain distance D between the two first electrodes 21 so as to make the sensor have better response to the multi-axis force acted on the elastic body 60. Moreover, for locating the elastic body 60 on the second surface 20b of the first flexible substrate 20, at least one adhesive layer 70 is disposed between the elastic body 60 and the second surface 20b of the first flexible substrate 20.

Figure 2:
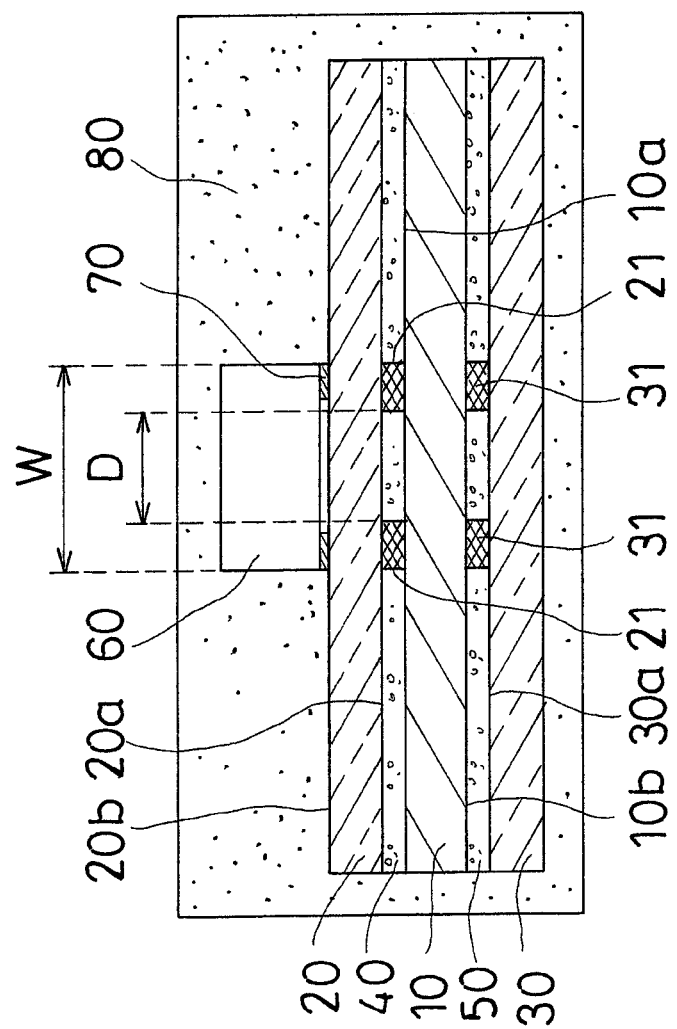
FIG. 2 is a schematic drawing showing an embodiment of a flexible piezoelectric tactile sensor with sealant according to the present invention.

By the adhesive layer 70, the elastic body 60 is connected firmly with the second surface 20b of the first flexible substrate 20. In this embodiment, the adhesive layer 70 is acrylic glue. Furthermore, refer to FIG. 2, in order to increase reliability of the flexible piezoelectric tactile sensor, a molding compound 80 is used to cover the piezoelectric thin film 10, the first flexible substrate 20, the second flexible substrate 30 and the elastic body 60. Thus the long-term reliability of the flexible piezoelectric tactile sensor is improved. In this embodiment, the molding compound 80 is an elastic material and the preferred material for the molding compound 80 is polydimethysiloxane (PDMS).

Figure 3B:
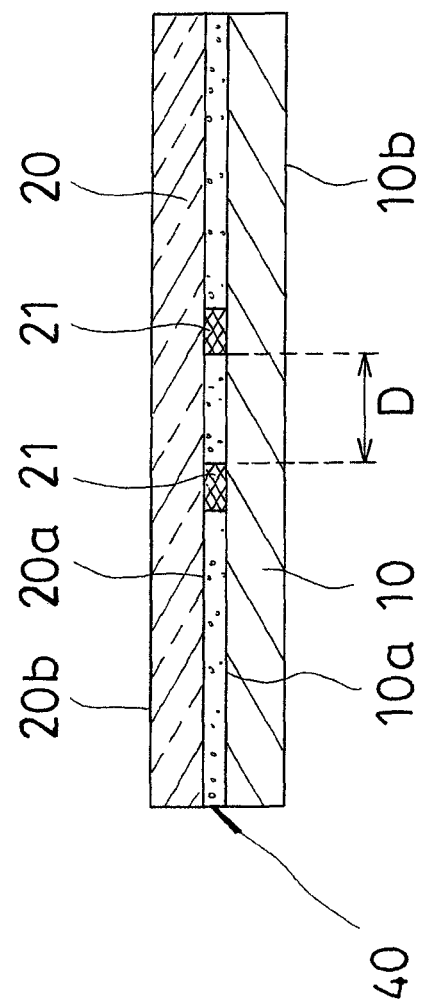
Figure 3C:
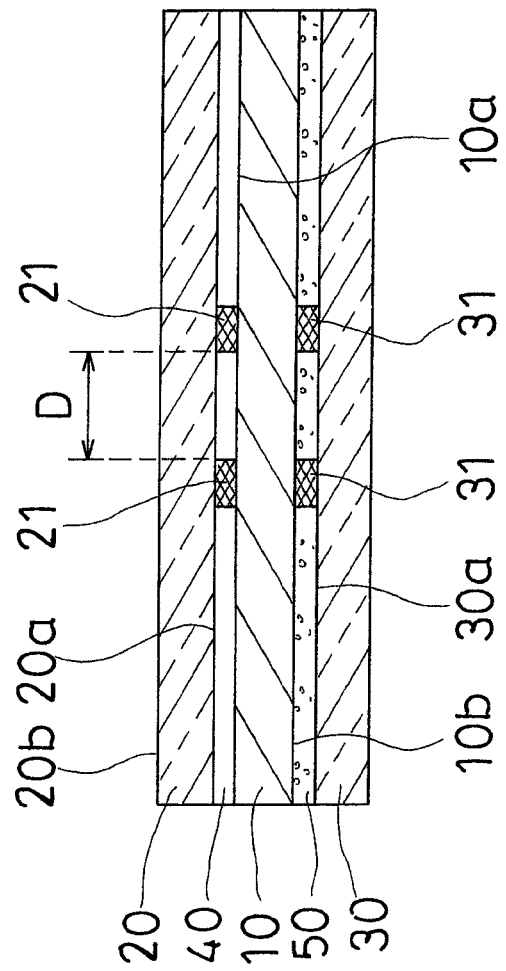
Figure 3D:
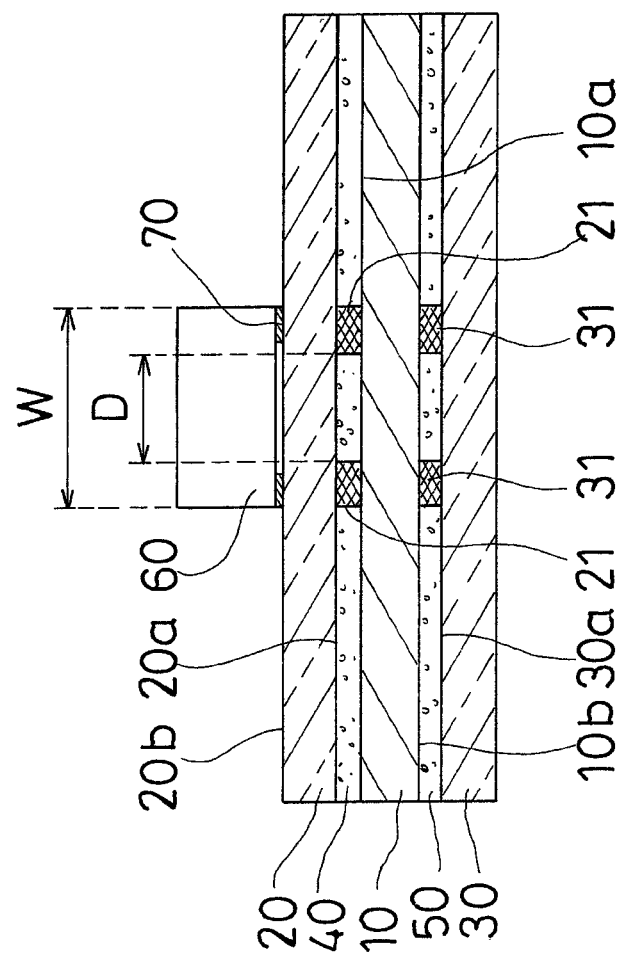

A method for manufacturing flexible piezoelectric tactile sensors is revealed from FIG. 3A to FIG. 3E. Refer to FIG. 3A, firstly provide a piezoelectric thin film 10. In this embodiment, the piezoelectric thin film 10 is a PVDF thin film having an upper surface 10a and a lower surface 10b. Then refer to FIG. 3B, arrange a first flexible substrate 20 on the upper surface 10a of the piezoelectric thin film 10. In this embodiment, the first flexible substrate 20 is a Cu/Polyimide substrate with a first surface 20a facing the upper surface 10a, a second surface 20b opposite to the first surface 20a and a plurality of first electrodes 21 formed on the first surface 20a. These first electrodes 21 are electrically connected with the piezoelectric thin film 10. In this embodiment, the first electrodes 21 are formed by copper foil that is patterned by conventional printed circuit board manufacturing processes and located on a surface of a substrate. There is a certain distance D between the two adjacent first electrodes 21. Moreover, in this embodiment, a first connection layer 40 is disposed between the first flexible substrate 20 and the piezoelectric thin film 10 for joining the first flexible substrate 20 with the piezoelectric thin film 10. The first connection layer 40 is preferably an ACF. Thus the first connection layer 40 electrically connects those first electrodes 21 with the piezoelectric thin film 10. Refer to FIG. 3C, arranged a second flexible substrate 30 on the lower surface 10b of the piezoelectric thin film 10. In this embodiment, the second flexible substrate 30 is also a Cu/Polyimide substrate that includes a third surface 30a facing the lower surface 10b, and a plurality of second electrodes 31 formed on the third surface 30a. These second electrodes 31 are electrically connected with the piezoelectric thin film 10. In this embodiment, these second electrodes 31 are also formed by copper foil that is patterned by conventional printed circuit board manufacturing processes and located on a surface of a substrate.

Furthermore, in this embodiment, a second connection layer 50 is arranged between the second flexible substrate 30 and the piezoelectric thin film 10 for bonding the second flexible substrate 30 with the piezoelectric thin film 10. The second connection layer 50 is preferably an ACF so that it can electrically connect those second electrodes 31 with the piezoelectric thin film 10. At last, refer to FIG. 3D, dispose an elastic body 60 on the second surface 20b of the first flexible substrate 20 and the position of the elastic body 60 is corresponding to the positions of those first electrodes 21 on the first flexible substrate 20. In this embodiment, the elastic body 60 is a force transmission part in a columnar shape, preferably made from silicone rubber.

In addition, the elastic body 60 is in a width of W. In this embodiment, the width W of the elastic body 60 is larger than the distance between two adjacent first electrodes 21 so that the sensor has better response to the multi-axis force acted on the elastic body 60. This embodiment further includes an adhesive layer 70 that is disposed between the elastic body 60 and the second surface 20b of the first flexible substrate 20 for locating and connecting the elastic body 60 firmly to the second surface 20b of the first flexible substrate 20. In this embodiment, the adhesive layer 70 is acrylic glue.

Figure 3E:
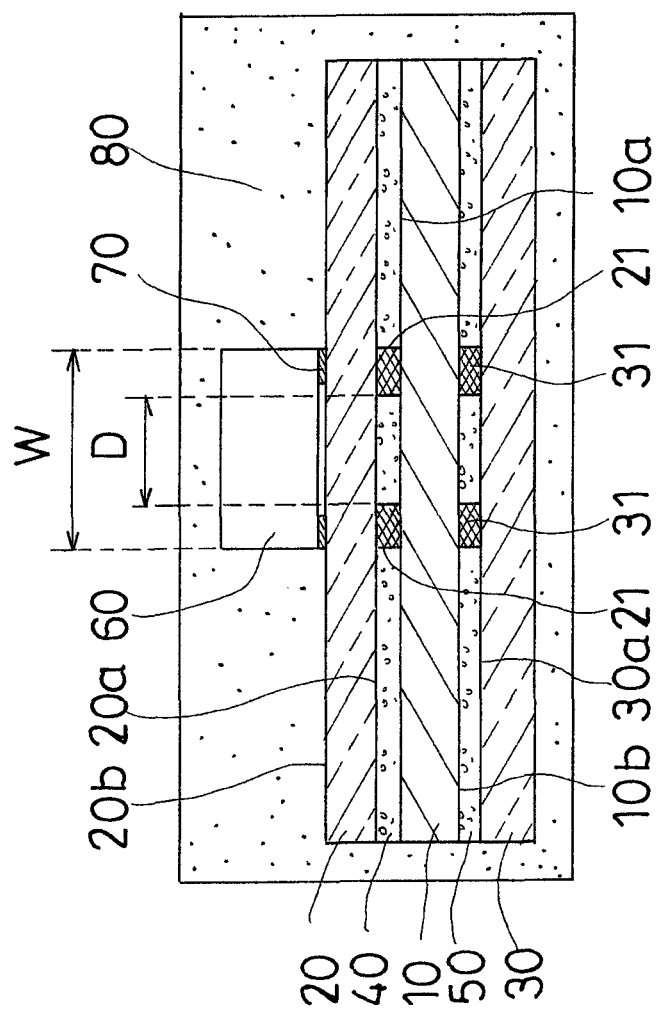

Refer to FIG. 3E, in order to improve reliability of the flexible piezoelectric tactile sensor, the embodiment further includes a molding compound 80 that covers the piezoelectric thin film 10, the first flexible substrate 20, the second flexible substrate 30 and the elastic body 60. In this embodiment, the molding compound 80 is an elastic material. The material for the molding compound 80 is preferably PDMS.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A flexible piezoelectric tactile sensor comprising:
a piezoelectric thin film having an upper surface and a lower surface;
a first flexible substrate disposed on the upper surface of the piezoelectric thin film and the first flexible substrate having a first surface facing the upper surface, a second surface opposite to the first surface, and a plurality of first electrodes formed on the first surface and electrically connected with the piezoelectric thin film;
a second flexible substrate arranged on the lower surface of the piezoelectric thin film and the second flexible substrate including a third surface facing the lower surface and a plurality of second electrodes formed on the third surface and electrically connected with the piezoelectric thin film;
at least one elastic body set on the second surface of the first flexible substrate and corresponding to the first electrodes of the first flexible substrate; and
a first connection layer disposed between the first flexible substrate and the piezoelectric thin film, said first connection layer is an anisotropic conductive film (ACF).

2. The device as claimed in claim 1, wherein the first connection layer electrically connects the first electrodes with the piezoelectric thin film.

3. The device as claimed in claim 1, wherein the flexible piezoelectric tactile sensor further includes a second connection layer that is arranged between the second flexible substrate and the piezoelectric thin film.

4. The device as claimed in claim 3, wherein the second connection layer is an anisotropic conductive film (ACF).

5. The device as claimed in claim 4, wherein the second connection layer electrically connects the second electrodes with the piezoelectric thin film.

6. The device as claimed in claim 1, wherein the elastic body has a certain width and there is a certain distance between the two adjacent first electrodes; the certain width of the elastic body is larger than the certain distance.

7. The device as claimed in claim 1, wherein the flexible piezoelectric tactile sensor further includes at least one adhesive layer that is disposed between the elastic body and the first flexible substrate.

8. The device as claimed in claim 1, wherein flexible piezoelectric tactile sensor further includes a molding compound that covers the piezoelectric thin film, the first flexible substrate, the second flexible substrate and the elastic body.

* * * * *